(12) United States Patent
Eriksson et al.

(10) Patent No.: US 7,776,642 B2
(45) Date of Patent: Aug. 17, 2010

(54) QUANTUM-WELL PHOTOELECTRIC DEVICE ASSEMBLED FROM NANOMEMBRANES

(75) Inventors: Mark A. Eriksson, Madison, WI (US); Max G. Lagally, Madison, WI (US); Arnold Melvin Kiefer, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 84 days.

(21) Appl. No.: 12/120,933

(22) Filed: May 15, 2008

(65) Prior Publication Data

US 2009/0283749 A1    Nov. 19, 2009

(51) Int. Cl.
*H01L 21/00*    (2006.01)

(52) U.S. Cl. .................. 438/74; 438/109; 438/734; 438/962; 257/23; 257/25; 257/E29.069

(58) Field of Classification Search .............. None
See application file for complete search history.

(56) References Cited

U.S. PATENT DOCUMENTS

| | | | |
|---|---|---|---|
| 7,229,901 B2 | 6/2007 | Savage et al. | |
| 2003/0089392 A1* | 5/2003 | Rohr et al. | 136/255 |
| 2005/0156153 A1* | 7/2005 | Futagawa | 257/14 |
| 2005/0280026 A1* | 12/2005 | Isaacson et al. | 257/192 |
| 2006/0115917 A1* | 6/2006 | Linden | 438/46 |

\* cited by examiner

*Primary Examiner*—Evan Pert
*Assistant Examiner*—Scott R Wilson
(74) *Attorney, Agent, or Firm*—Boyle Fredrickson, S.C.

(57) ABSTRACT

A quantum-well photoelectric device, such as a quantum cascade laser, is constructed of monocrystalline nanoscale membranes physically removed from a substrate and mechanically assembled into a stack.

21 Claims, 5 Drawing Sheets

QUANTUM-WELL PHOTOELECTRIC DEVICE ASSEMBLED FROM NANOMEMBRANES

STATEMENT REGARDING FEDERALLY SPONSORED RESEARCH OR DEVELOPMENT

This invention was made with United States government support awarded by the following agencies:
DOE DE-FG02-03ER46028
NSF 0325634
USAF/AFOSR FA9550-06-1-0487
The United States government has certain rights in this invention.

CROSS REFERENCE TO RELATED APPLICATION

BACKGROUND OF THE INVENTION

The present invention relates to solid-state lasers and specifically to a method of fabricating a quantum-well photoelectric device, for example, a quantum cascade laser or quantum cascade photodetector.

Quantum cascade lasers emit light when electrons (holes) cascade through a series of quantum wells positioned between electrodes of the laser. The electrodes create an energy gradient among successive quantum wells, and within a quantum well, transient confinement of electrons (holes) splits the conduction (valence) band of the semiconductor into subbands. When the electrons (holes) pass between the subbands, stimulated emission of photons may occur. After the transition between subbands, the electrons (holes) may tunnel to an adjacent quantum well and a lower (higher) subband.

Each quantum well is defined by a thin layer of semiconducting material flanked by barrier materials whose conduction (valence) band is offset to a higher (lower) energy level. Current quantum cascade lasers are typically fabricated of GaAs and AlGaAs where the AlGaAs provides the barrier layer. During fabrication, successive layers of GaAs and AlGaAs are deposited using standard integrated-circuit deposition techniques such as chemical vapor deposition or physical vapor deposition.

Quantum cascade lasers may also be made out of alternating Si/SiGe alloy layers. These devices are typically made with SiGe alloy wells of approximately 70% Si with barrier layers of pure Si and generate emission via the movement of holes. Recently, some have suggested using SiGe alloy wells of approximately 80% Ge with Ge barriers for emission by electron transitions.

Quantum cascade lasers with significant power may require many defect-free layers of semiconductor and barrier material. Defects are imperfections in the crystal structure that adversely affect movement of electrons or holes through the device. Defects can be created when too much strain builds up within the multiple layers and a layer "relaxes" by moving atoms out of the ideal crystallographic positions.

The build up of strain in the multilayer structure is caused by the different lattice constants of the materials. For example, the different layers of a device employing Si/SiGe will be strained because the Ge atom is bigger than the Si atom and thus the Ge atoms get forced into a smaller volume available in a predominantly Si structure.

The technique of strain-symmetrization is often used to control internal stress. Instead of putting all of the strain in the SiGe alloy layers, for example, some of the strain is put into the intermediate Si (barrier) layers. This is done by starting with a "virtual substrate" with a lattice constant between that of Si and SiGe. This virtual substrate is grown such that the Si layers are stretched ((tensilely strained) and the SiGe alloy layers are compressed. The remaining layers are grown on this virtual substrate, which provides a compromise lattice constant ideally minimizing strain within the subsequent layers.

One way to create a virtual substrate is to grow a SiGe alloy on a bulk Si substrate. By gradually increasing the Ge concentration, the desired lattice constant is reached. Despite best efforts, however, such virtual substrates have surface defects and further surface roughness/waviness that eventually cause problems in the subsequently deposited layers. As a result, the crystallographic quality steadily degrades as the structure is grown and before a useful device is achieved.

SUMMARY OF THE INVENTION

The present invention provides an improved method of manufacturing a quantum cascade laser or similar quantum-well device by the manipulation and assembly of physically separate monocrystalline semiconductor layers. In one embodiment, this technique may be used to produce a superior virtual substrate by detaching a symmetric multilayer structure from its substrate, allowing unrestrained equalization of the stresses between the layers. The virtual substrate may be removed from a larger wafer, for example, an SOI wafer, whose quality is well-characterized. The resulting virtual substrate provides a foundation for growing more consistent semiconductor layers with lower defects than can be obtained with conventional virtual substrates.

In a further embodiment, the number of additional layers grown on each virtual substrate is limited. When the limit is reached, a "subunit" of the virtual substrate and its layers is removed from its support and combined with other similar subunits to create the completed device. Limiting the layers in each subunit limits any accumulating deviation from the lattice constant of the virtual substrate, thus reducing crystallographic defects that degrade device performance.

The present invention also raises the possibility of constructing a quantum-well device from separately fabricated semiconductor layers, each fabricated in isolation, separated from its original substrate, and physically combined as desired. In this case a virtual substrate may not be required.

The technique of the present invention may allow the production of a silicon-based quantum cascade laser that can produce shorter wavelengths of light (down to 1.2 μm) than may be obtained with gallium arsenide or other semiconductors. The ability to manufacture a laser from silicon (rather than GaAs) potentially allows the production of quantum cascade lasers that are compatible with the processing steps used in the fabrication of conventional silicon-based integrated circuits.

Specifically then, the present invention provides a method of manufacturing a quantum-well photoelectric device having multiple quantum-well layers and barrier layers formed in a stack. The method includes the steps of repeatedly fabricating at least one semiconductor layer of the stack on a substrate and repeatedly releasing the semiconductor layers to provide a released "component layer". Alternatively, several layers or layer stacks may be fabricated simultaneously on the same substrate to ensure uniformity. The multiple released component layers are then assembled to provide the multiple quantum well layers and barrier layers of the stack. A first and second electrode is attached on opposite layers of the stack for the communication of electrical power between the stack and an external circuit.

Thus, it is an object of at least one embodiment of the invention to provide for quantum-well photoelectric devices with improved crystal structures by physically assembling separate component layers together. By limiting the number of layers formed before the separation, defects caused by cumulative strain are limited.

The invention may fabricate at least two semiconductor layers before release, one forming a quantum-well layer and one forming a barrier layer on the substrate;

It is thus an object of at least one embodiment of the invention to limit the stress between layers by physically separating the layers from a substrate to allow stress equalization.

The invention may further attach the released semiconductor layers to a substrate as a virtual substrate and deposit multiple additional layers on the virtual substrate, finally releasing the virtual substrate and the multiple additional layers from the substrate as the released component layer.

It is thus another object of at least one embodiment of the invention to provide an improved virtual substrate for growing additional layers. It is a further object of at least one embodiment of the invention to limit the number of layers grown on each virtual substrate to prevent the accumulation of stresses while nevertheless providing multiple layers on each virtual substrate to reduce the number of interfaces between component layers.

The released layer may include at least three semiconductor layers where the outer two layers are identical materials.

Thus it is an object of at least one embodiment of the invention to provide for stress balancing in the virtual substrate allowing release of the virtual substrate without excessive curling.

The released semiconductor layer may include a single-crystal silicon layer from an SOI wafer.

It is thus an object of at least one embodiment of the invention to provide for a readily available single-crystal layer as a starting point for the invention A barrier material may be formed on opposite faces of the released layers prior to assembly of the layers in the stack whereby an interface between layers in the stack is within the barrier layer.

It is thus an object of at least one embodiment of the invention to concentrate defects within the barrier layer where they may have a lesser effect on electron or hole flow.

The barrier layer may be non-crystalline.

It is thus an object of at least one embodiment of the invention to provide a method that may work with amorphous barrier layers.

The invention may include the step of attaching the stack to a silicon wafer and further processing of the wafer to produce electrically connected integrated circuit components.

It is thus an object of one embodiment of the invention to provide a quantum well of an electrical device that can be joined with integrated circuitry and further processed with fabrication techniques compatible with the integrated circuitry.

Alternatively or in addition, the invention may allow for the formation of integrated circuit components on the individual layers and optionally interconnecting the layers electrically within the stack.

It is thus an object of one embodiment of the invention to permit the integration of circuitry into the layers of the quantum cascade laser and to provide for the possibility of three-dimensional integration in multilayer devices.

These particular objects and advantages may apply to only some embodiments falling within the claims and thus do not define the scope of the invention.

DETAILED DESCRIPTION OF THE PREFERRED EMBODIMENT

Figure 1:
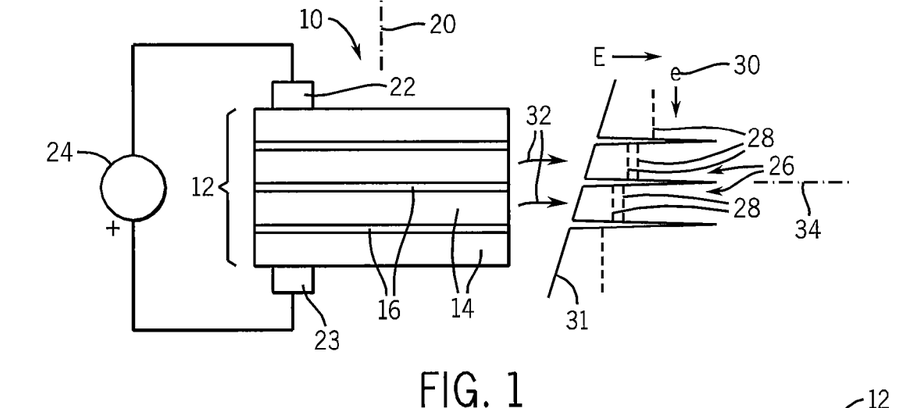
FIG. 1 is a simplified cross-section in elevation of a quantum cascade laser stack per the present invention aligned with an energy diagram showing the quantum wells and the subbands created by quantum confinement.

Referring now to FIG. 1, the present invention provides a quantum-well photoelectric device such as a silicon-based quantum cascade laser 10. The laser 10 employs a stack 12 of semiconductor layers 14 separated by barrier layers 16, preventing classical electron flow. The number of layers shown in FIG. 1 is greatly reduced for clarity.

The stack 12 extends generally along an axis 20 with each of the layers 14 and 16 generally perpendicular to the axis 20, and the outer layers 14 attached to electrodes 22 and 23 which may be biased with an electrical voltage source 24 to provide, in this example, a negative relative voltage at the top of the stack 12 at electrode 22, providing a source of electrons that are drawn to positive relative voltage at the bottom of the stack 12 at electrode 23.

The barrier layers 16 surrounding each semiconductor layer 14 provide a high dielectric electrical insulation producing quantum well 26 shown in a potential energy line 31 depicting generally the energy required for an electron 30 to move along axis 20. The potential-energy line 31 decreases generally from the top of the stack 12 to the bottom of the stack 12 but includes right extending peaks (as depicted) representing the electron barriers formed by the barrier layers 16 and the walls of the quantum wells 26.

The quantum wells 26 confine electrons 30 into thin planar regions such as to create subbands 28 of permissible electron energy states for the electrons within each quantum well 26 that differ from the normal energy bands of a bulk semiconductor. The energy of the subbands 28 is largely dictated by the geometry of the quantum well 26.

Under the influence of the electrical voltage from electrical voltage source 24, electrons 30 may pass from electrode 22 to electrode 23 moving from quantum well 26 to quantum well 26 by tunneling through the barrier layers 16. In this tunneling process, the electrons 30 drop from higher subbands 28 to lower subbands 28 resulting in the emission of photons 32 along an axis 34 perpendicular to axis 20.

This tunneling process may be distinguished from classic electron-hole pair recombination found in conventional semiconductor lasers. An electron-hole pair is not created or extinguished upon the formation of the photon 32 in a quantum cascade laser 10.

Figure 2:
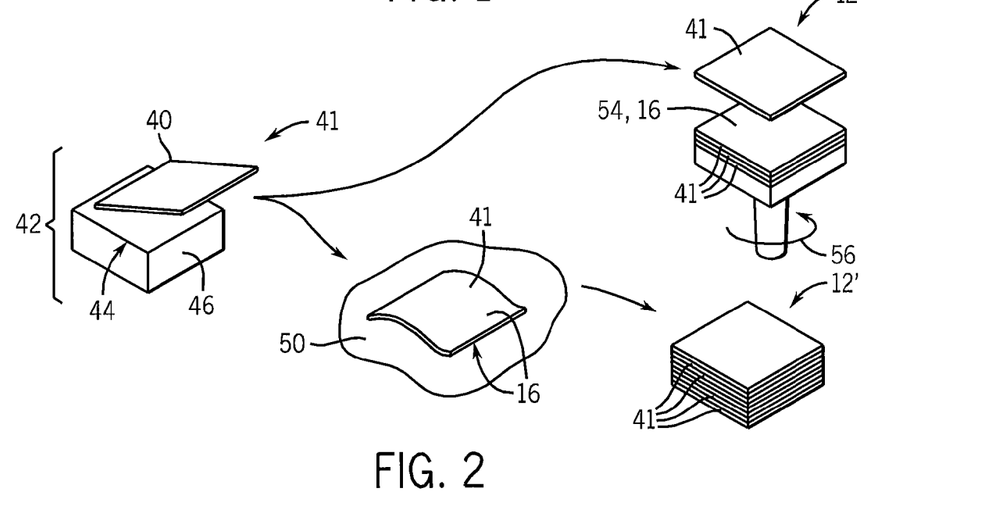
FIG. 2 is a pictorial diagram of the manufacturing steps used to produce a quantum-well photoelectric device, such as the quantum cascade laser of FIG. 1 in a first embodiment of the present invention.

Referring now to FIG. 2, the stack 12 may be assembled by lamination of physically separate nanoscale membranes. In one embodiment, this process begins with a silicon-on-insulator (SOI) wafer 42. Such wafers 42 are used widely in the integrated-circuit industry and provide a monocrystalline silicon layer 40 on top of an oxide layer 44 that in turn is supported by a bulk silicon substrate 46.

SOI wafers 42 may be manufactured by a variety of processes, for example by ion beam implantation of oxygen into the silicon substrate 46 to form a buried oxide layer 44. Alternatively, the SOI wafer 42 may be created by bonding a second silicon wafer to the bulk silicon substrate 46 by means of an intervening oxide layer 44. The second silicon wafer is then thinned to produce the upper silicon layer 40 of the SOI wafer 42.

The upper silicon layer 40 of the SOI wafer 42 may be thinned using the so-called "Smart Cut" method in which the upper silicon layer 40 is fractured along a line of bubbles near the oxide layer 44, the bubbles created by hydrogen implantation. This technique is described generally in U.S. Pat. No. 6,372,609 to Aga et al. entitled: Method of Fabricating SOI Wafer by Hydrogen Ion Delamination Method and SOI Wafer Fabricated by the Method, issued Apr. 16, 2002 and hereby incorporated by reference. Thinning of the upper wafer may also be done by oxidation of the exposed surface of the upper silicon layer 40 to create silicon dioxide and then removing the silicon dioxide layer with hydrofluoric acid. If oxidation is accomplished via immersion in a solution of ammonium hydroxide and hydrogen peroxide solution, approximately 2.5 nm of silicon may be removed per cycle. Alternatively, the upper silicon layer 40 of the SOI wafer 42 may be mechanically ground and polished. Ultimately an extremely thin upper silicon layer 40 may be produced having a thickness less than 100 nm and, for the purpose of the quantum cascade laser 10, having a thickness that is preferably about 2 to 6 nm.

Referring still to FIG. 2, as described in more detail in U.S. Pat. No. 7,229,901 entitled Fabrication Of Strained Heterojunction Structures, issued Jun. 12, 2007, assigned to the assignee of the present invention and hereby incorporated by reference, the silicon layer 40 of the SOI wafer 42 may be separated from the silicon substrate 46 by a selective etching to remove the oxide layer 44, for example, by irrigation with hydrofluoric acid. To facilitate this separation of the silicon layer 40, a pattern of holes may be etched in the silicon layer 40 to provide improved access for the hydrofluoric acid etchant.

The silicon layer 40 is mechanically separated from the silicon substrate 46 to provide a nanoscale membrane 41 having extremely smooth faces and a monocrystalline structure with few defects.

In a first process path, the nanoscale membrane 41 may be treated by processing in an oxygen atmosphere 50 to create a thin barrier layer of silicon dioxide on the opposed faces of the nanoscale membrane 41. Alternatively, a different chemical bath (not shown) may be used to create a thin film of silicon nitride or other high-dielectric material. The nanoscale membrane 41, now also opposed to barrier layers 16, is then placed in a stack 12' on top of previously separated nanoscale membrane 41. The nanoscale membranes 41 of the stack 12' may be bonded, for example, using the silicon dioxide as a bonding medium. This bonding process may comprise a two-step annealing for approximately 5 minutes at 100° C. and five minutes at 500° C.

Figure 3:
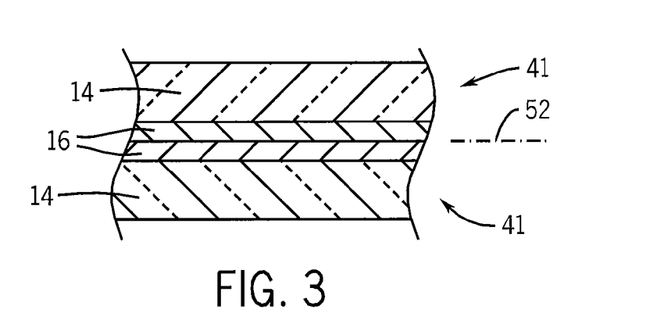
FIG. 3 is a cross-sectional view through two adjacent layers of the stack of FIG. 1 showing positioning of the interface between layers within the dielectric material.

Referring now to FIG. 3, the bonding process is such that the bonding interface 52 is between two barrier layers 16 so that any defects introduced by the bonding process are not within the silicon layers 14 and thus do not affect the quantum wells 26.

Referring again to FIG. 2, in a variation on this process, the barrier layers 16 may be formed by a topically applied material that may or may not react with the semiconductor of the nanoscale membrane 41. For example the nanoscale membranes of 41 are placed on the stack 12, their exposed faces may be coated with a layer of insulating material 54, for example, spun on glass smoothed to a thin layer by rotation 56 of the stack 12 which provides the barrier layer 16. After the insulating material 54 is deposited, a next nanoscale membrane 41 may be placed on the stack. Using this procedure the barrier layer need not be a silicon compound.

Figure 4A:
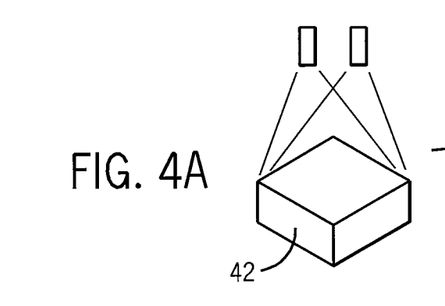
FIG. 4 is a figure similar to that of FIG. 3 showing the manufacturing steps used to produce a quantum-well photoelectric device in a second embodiment of the present invention.
Figure 5A:
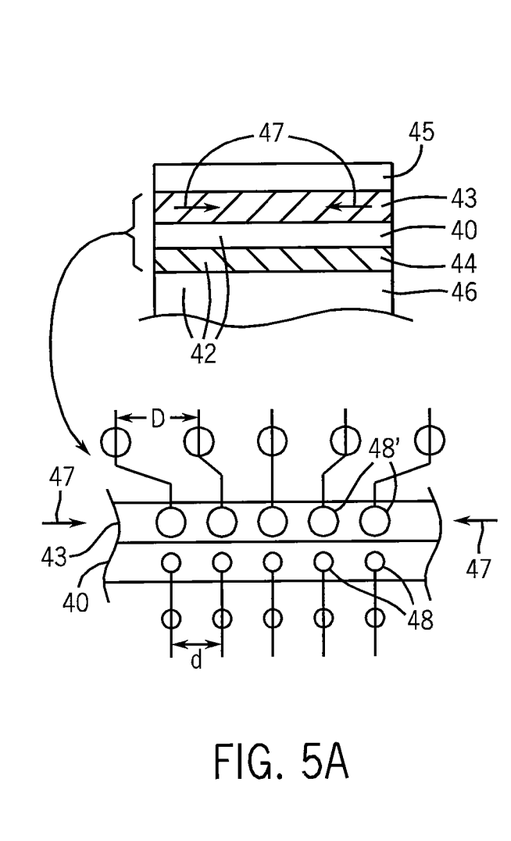
FIGS. 5a-5c are figures similar to that of FIG. 3 showing the creation of a virtual substrate using the process of FIG. 4.

Referring now to FIGS. 4a and 5a, in an alternative embodiment an SOI wafer 42 may be treated, for example, by molecular beam epitaxy, chemical vapor deposition, or other techniques known in the art of integrated-circuit manufacture, to deposit on the upper silicon layer 40 a silicon germanium alloy layer 43 or other semiconductor alloy with a different lattice constant (as will be described below). On top of this silicon germanium alloy layer 43 an additional monocrystalline silicon layer 45 may be deposited roughly equal in width to the silicon layer 40 forming the top of the SOI wafer 42.

As will be generally understood in the art, the silicon layer 40 of the SOI wafer 42 will have a lattice constant d describing generally the distance between adjacent atoms 48 in the crystal lattice of silicon layer 40. During the deposition of the silicon germanium alloy layer 43 the larger crystal unit 48' of silicon germanium alloy, which would naturally have a lattice constant of D, will attempt to conform to the lattice constant d of the silicon layer 40. This results in an inward strain 47 (compression) of the silicon germanium layer alloy 43.

Figure 4B:
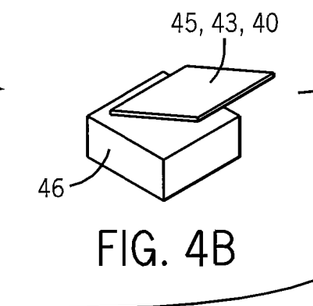
Figure 5B:
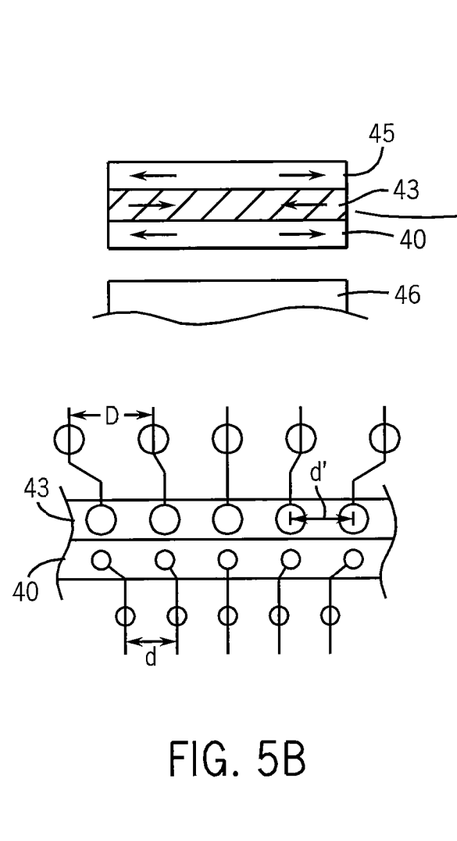

Referring to FIG. 4b and FIG. 5b, the SOI wafer 42 may be treated with hydrofluoric acid or the like, as described above, to dissolve the oxide layer 44 freeing layers 45, 43, and 40 from substrate 46. At this time the silicon layer 40, no longer constrained by the silicon oxide layer 44, expands slightly under the force of the silicon germanium alloy layer 43 until their stress is equalized to form a virtual substrate having an intermediate lattice constant d'.

Figure 4C:
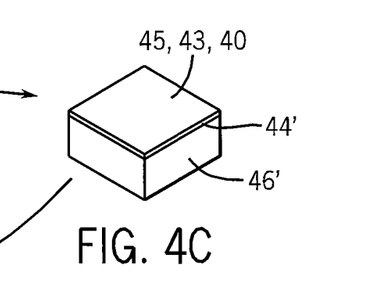
Figure 5C:
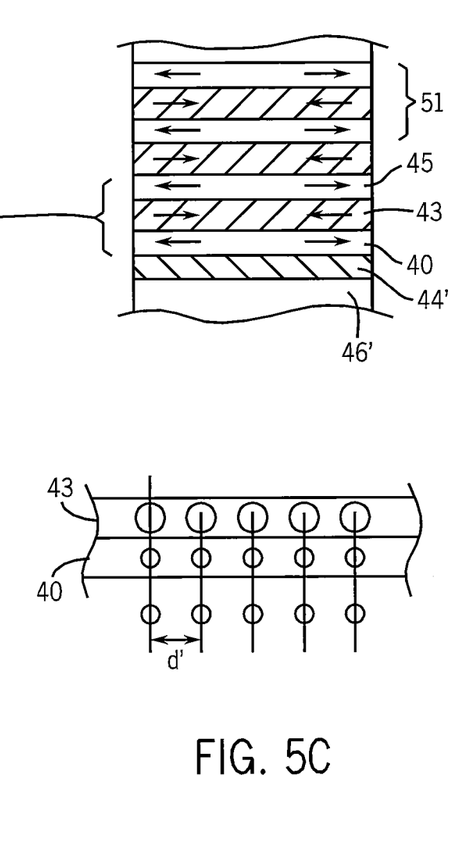

Referring to FIG. 4c and FIG. 5c, the released layers 45, 43 and 40 are each slightly strained; however, the stresses between layers are in balance because of the symmetry of the structure and the released layers 45, 43 and 40 do not curl during release despite their extremely thin nanoscale dimensions.

These layers 45, 43 and 40 provide a virtual substrate that may be attached to a second bulk silicon substrate 46 topped by an oxide layer 44' and attached thereto. The new lattice constant d' resulting from the relaxation occurring in the initial release of the layers 45, 43, and 40 is preserved during this attachment process. The attachment may be provided by the natural adhesion of the extremely smooth surfaces of the layer 40 or may be promoted by a heating process bonding silicon layer 40 to the oxide layer 44'.

Figure 4D:
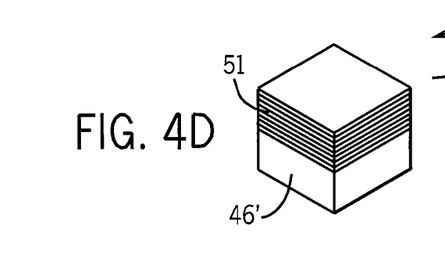

The virtual substrate formed by the layers 45, 43, and 40 is used as a basis for the growing of additional alternate Si and SiGe alloy layers 51 as shown in FIG. 4d and FIG. 5c. The additional layers 51 may be fabricated using the same process described with respect to FIG. 4a. Because the virtual substrate is strained Si, and because it provides an extremely smooth and low-defect growth surface, many more layers 51 may be grown than could be grown on unstrained Si (the conventional process) before the risk of a defect occurs. At some point, however, the risk of defects or structural disorder again gets high, because of the inherently inexact control of growth conditions or to unbalanced strain. Before the condition for the onset of defects occurs, the growth is halted and the full set of layers 51 including layers 45, 43 and 44 is removed from the substrate 46' (as shown in FIG. 4e) again by etching away the oxide layer 44'.

Figures 4E, 4G, 4H:
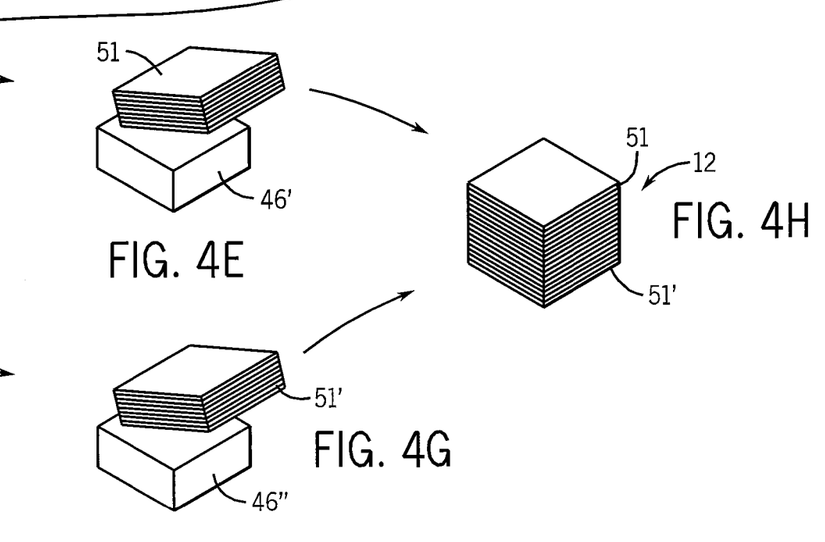
Figure 4F:
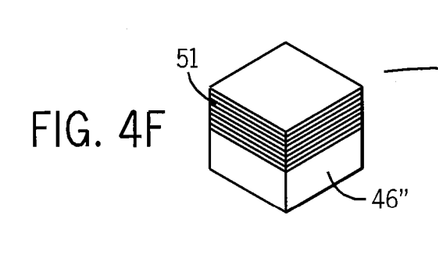

These component layers 51, 45, 43, and 44 are then combined as shown in FIG. 4h with additional layers 51', for example, formed on different substrates 46" using the same steps described above as shown generally in FIGS. 4f and 4g. This combination produces a multilayered stack 12 formed of layers 51, 51', and additional layers (not shown). It should be understood that the different substrates 46' and 46" could in fact be different portions of the same substrate.

Figure 6:
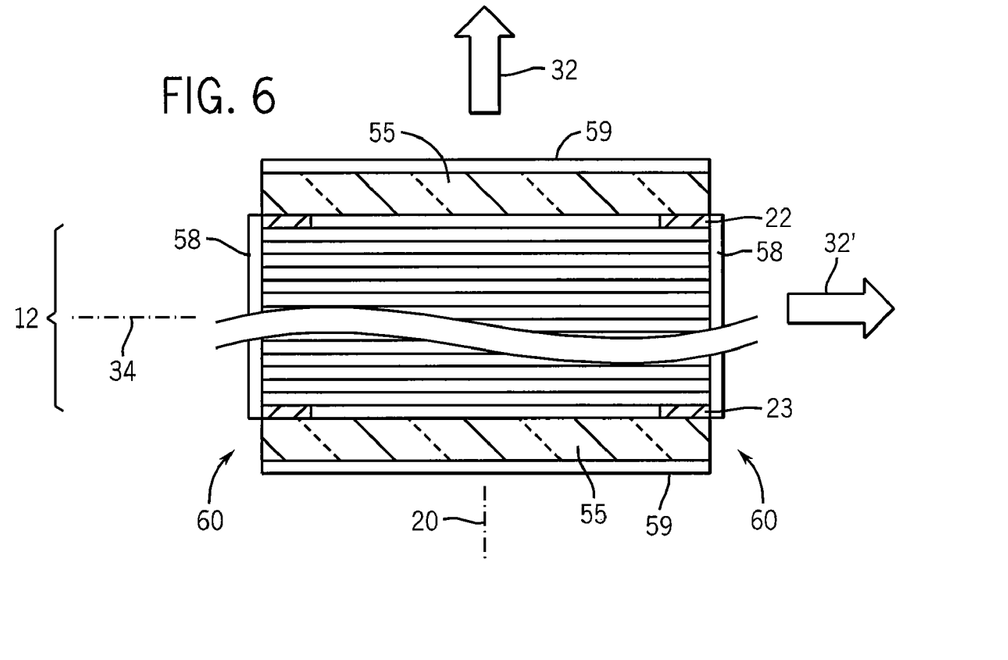
FIG. 6 is a figure similar to that of FIG. 1 showing cladding of the stack produced by the above techniques to produce a waveguide and the application of reflective surfaces to the stack to produce a resonant structure for lasing activity.

Referring now to FIG. 6, the top and bottom of the stack 12 may have ring electrodes 22 and 23 attached thereto, of the ring configuration allowing the exit of photons 32 perpendicular to the plane of the stack 12. Alternatively, photons 32' may exit along the plane of the stack in an alternative embodiment.

In either configuration, the stack 12 is clad to provide a resonant optical cavity for laser action. In this situation where photons 32 exit perpendicular to the plane of the stack 12, a transparent cladding material 55 may be used to support a mirror 59 (such as a metallic layer, a Bragg mirror or the like) providing a partial reflection to promote stimulated emission. Additional cladding material 58 may be placed on the sides of the stack 12 to contain light therein, or alternatively the sides may be polished and the difference of index of refraction between the material of the stack 12 and surrounding air may be used to promote the necessary internal reflection. For an operating mode where photons 32 exit along the plane of the stack 12, these materials are simply reversed in function.

Figure 7A:
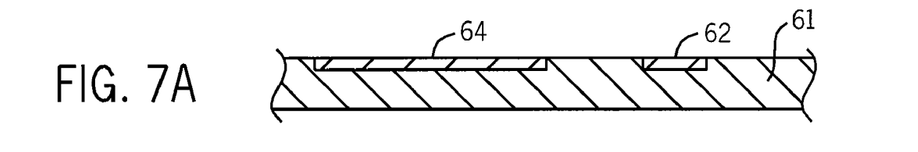
FIGS. 7a-7c are cross sectional elevational views of an integrated circuit wafer showing attachment of the stack of the present invention to be joined with other integrated circuit elements.
Figure 7B:
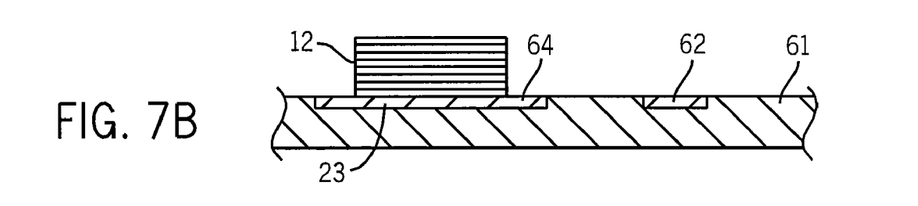
Figure 7C:
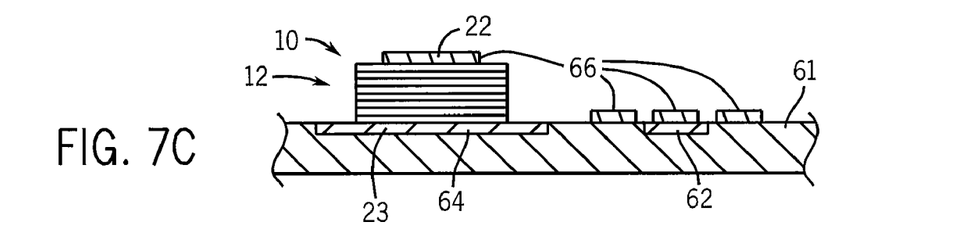

Referring now to FIGS. 7a-7c, the stack 12 of the present invention may be attached to a conventional integrated-circuit wafer 61 having doped regions 62 and metallized channels 64 exposed at its upper surface (as shown in FIG. 7a) according to techniques well-known in the art. As shown in FIG. 7b, the stack 12 may be bonded on a lower face to the metallized channel 64 to provide for electrode 23 that may communicate with other devices on the integrated-circuit wafer 61. Referring to FIG. 7c, a subsequent metallization pattern 66 may then be applied to form electrode 22 and to provide electrical interconnection to other integrated-circuit devices such as transistors, resistors, and the like. After the stack 12 is bonded to the conventional integrated-circuit wafer 61, additional integrated-circuit fabrication steps compatible with silicon may be taken, for example, those used for the fabrication of CMOS circuits. The CMOS circuitry may provide driving circuitry for the quantum cascade laser 10.

Figure 8:
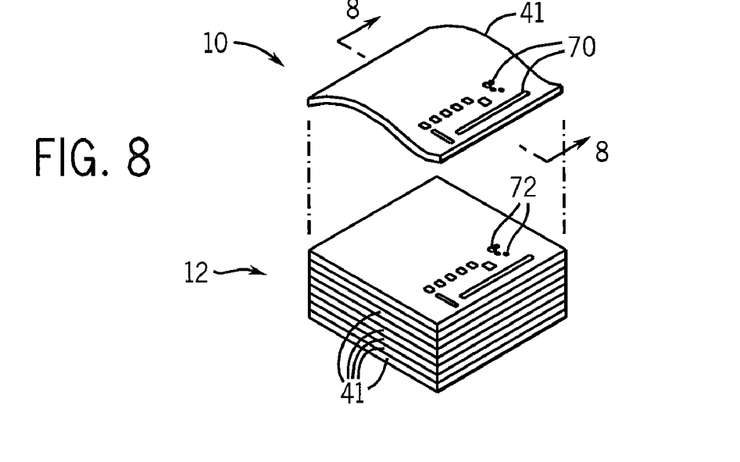
FIG. 8 is a perspective view of an alternate embodiment of the quantum cascade stack showing one layer being added to the stack where each layer of the stack contains separate integrated circuit elements.
Figure 9:
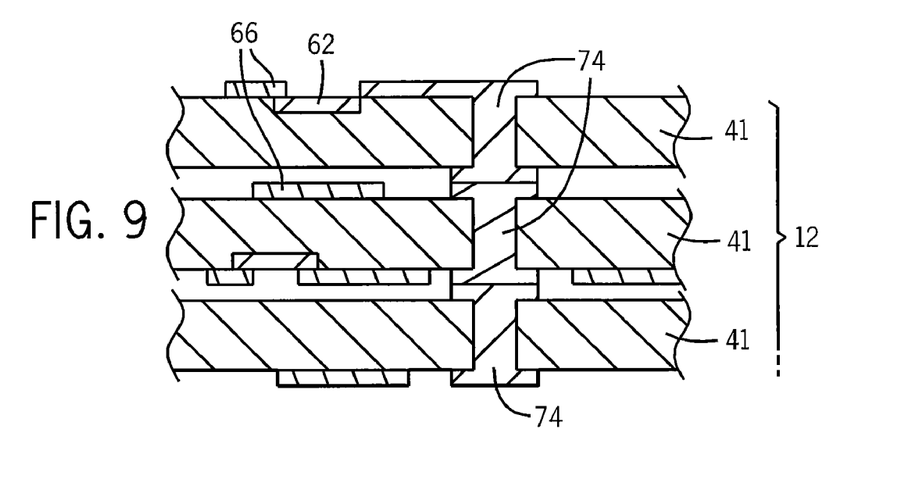
FIG. 9 is a cross-sectional view along line 8-8 of FIG. 8 showing a possible interconnection between the circuit elements of FIG. 7 using conductive bias.

Referring now to FIG. 8, in an alternative technique of connecting the stack 12 of the quantum cascade laser 10 of the present invention to other integrated circuitry, each nanoscale membrane 41 may be separately processed before incorporation into the stack 12 to form integrated-circuit elements 70 into a portion of the area of the nanoscale membrane 41, for example, displaced from the area providing the quantum wells. Other nanoscale membranes 41 may also have integrated-circuit elements 72 formed in them so that assembly of the nanoscale membrane 41 also assembles and interconnects integrated-circuit elements 70 and 72 and thus interconnects different membranes 41 for example through conductive vias. The integrated circuit elements 70 and 72 may be fabricated directly on the nanoscale membranes 41 based on their high-quality monocrystalline structure. As shown in FIG. 9, this interconnection process may, for example, make use of conductive vias 74 passing through the nanoscale membrane 41 that abut each other when the nanoscale membranes 41 are assembled within a stack 12. The vias 74 may be interconnected by a subsequent heating or pressure induced contact.

Figure 10:
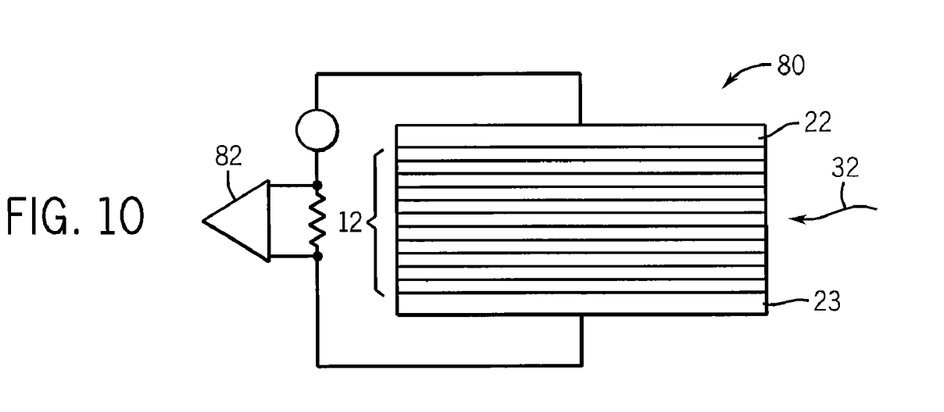
FIG. 10 is a figure similar to that of FIG. 1 showing the use of the structure of the present invention as a detector.

Referring now to FIG. 10, it will be understood from the above description, that the above described techniques are equally suitable for producing infrared photodetectors. Quantum well infrared photodetectors share the same general features as a quantum cascade laser except for the mode of operation which is determined by how the device is biased. In the photocurrent mode, a bias is applied across the device. Photons excite electrons (or demote holes) from the quantum wells into the continuum band for collection by a capacitor or current measuring device. In the photovoltaic mode, no bias is applied. Excited carriers tunnel from well-to-well in subbands. The internal displacement of charge creates a potential difference at the detector's terminals which may be measured by an instrumentation amplifier amplifier 82 or the like of a type well known in the art. The quantum well structure allows a precise tuning of the sensitivity of the photodetector 80 by manipulation of the geometry of the quantum wells.

It is specifically intended that the present invention not be limited to the embodiments and illustrations contained herein and the claims should be understood to include modified forms of those embodiments including portions of the embodiments and combinations of elements of different embodiments as come within the scope of the following claims.

What we claim is:

1. A method of manufacturing a quantum-well photoelectric device having multiple quantum-well layers and barrier layers formed in a stack, the method comprising the steps of:
    (a) repeatedly fabricating at least one semiconductor layer of the stack on a substrate;
    (b) repeatedly releasing the at least one semiconductor layer from the substrate to provide a released component layer;
    (c) physically assembling multiple released component layers to provide the multiple quantum-well layers and barrier layers of the stack; and
    (d) attaching a first and second electrode on opposite layers of the stack for a communication of electrical power between the stack and an external circuit.

2. The method of claim 1 wherein the layers are a single crystal.

3. The method of claim 1 wherein the at least one semiconductor layer has a thickness from 1 to 16 nm.

4. The method of claim 1 wherein step (a) fabricates at least two layers, one forming a quantum-well layer and one forming a barrier layer on the substrate.

5. The method of claim 4 including between steps (b) and (c) the steps of:
   (i) attaching the at least two layers to a support as a substrate with a strain modified lattice constant;
   (ii) depositing the multiple additional layers on the substrate with the strain modified lattice constant;
   (iii) releasing the substrate with the strain modified lattice constant and the multiple additional layers from the substrate as the released component layer.

6. The method of claim 1 wherein step (a) fabricates an odd number of layers greater than one where the outer two layers are identical materials for stress balancing and wherein at least one layer has a nanoscale thickness.

7. The method of claim 1 wherein at step (a) the at least one semiconductor layer includes a single-crystal silicon layer from an SOI wafer.

8. The method of claim 1 wherein the barrier layer is formed on opposite faces of the released component layers prior to assembly of the component layers in the stack whereby an interface between layers in the stack is within the barrier layer.

9. The method of claim 1 wherein the barrier layers are non-crystalline.

10. The method of claim 1 including between steps (b) and (c) the step of:
    (i) treating the released component layer to form an outer barrier layer.

11. The method of claim 1 wherein at step (c) an interface between the multiple released component layers is between abutting barrier layers.

12. The method of claim 1 further including the step of applying reflective material on opposed faces of the stack to form an optical cavity.

13. The method of claim 1 further including the step of attaching the stack to a silicon wafer and further processing of the wafer to produce electrically connected integrated-circuit components.

14. The method of claim 1 further including the step of forming integrated-circuit components on the layers and interconnecting the layers electrically within the stack using electrical conductors.

15. The method of claim 1 including the step of exposing the stack to light and extracting electrical power with the external circuit.

16. The method of claim 1 including the step of applying electrical power to the stack from the external circuit to produce a light emission from the stack.

17. A quantum-well photoelectric device constructed according to the steps of:
    (a) repeatedly fabricating at least one semiconductor layer on a substrate;
    (b) repeatedly releasing the at least one semiconductor layer from the substrate to provide a released component layer;
    (c) physically assembling multiple released component layers to provide the multiple quantum-well layers and barrier layers of a stack; and
    (d) attaching a first and second electrode on opposite layers of the stack for a communication of electrical power between the stack and an external circuit.

18. A quantum-well photoelectric device comprised of:
    a stack of alternating quantum-well material having a thickness in a range of 1-16 nm and barrier material;
    a first and second electrode on opposite layers of the stack for a communication of electrical power between the stack and an external circuit; and
    wherein the stack is comprised of different single-crystal layers the crystal layers having different azimuthial orientations.

19. The quantum-well photoelectric device of claim 18 wherein the different single-crystal layers are of different compositions.

20. A method of manufacturing a substrate with a strain modified lattice constant for a quantum-well photoelectric device having multiple quantum-well layers and barrier layers formed in a stack, the method comprising the steps of:
    (a) forming at least one single crystal quantum-well layer and one barrier layer on a substrate;
    (b) releasing the at least one single crystal quantum-well layer and one barrier layer from the substrate to allow equalization of stress in the layers;
    (c) reattaching the at least one single crystal quantum well and one barrier layer to a substrate to provide a substrate with a strain modified lattice constant; and
    (d) growing additional quantum well layers on the substrate with the strain modified lattice constant.

21. A method of manufacturing a quantum-well photoelectric device having multiple quantum-well layers and barrier layers formed in a stack, the method comprising the steps of:
    (a) fabricating multiple layers of the stack on at least one substrate;
    (b) physically releasing the layers from the at least one substrate to produce multiple released component layers, each being a nanoscale membrane;
    (c) after step (b) physically assembling multiple released component layers by aligning broad faces of the nanoscale membranes against a planar surface to provide the multiple quantum-well layers and barrier layers of the stack; and
    (d) after steps (b) and (c) attaching a first and second electrode on opposite layers of the stack for a communication of electrical power between the stack and an external circuit.

* * * * *